US012589586B2

(12) United States Patent
Walker

(10) Patent No.: US 12,589,586 B2
(45) Date of Patent: Mar. 31, 2026

(54) POST-PRINT VACUUM DEGASSING

(71) Applicant: ASMPT SMT SINGAPORE PTE. LTD., Singapore (SG)

(72) Inventor: William Thomas Luke Walker, Sudbury (GB)

(73) Assignee: ASMPT SMT SINGAPORE PTE. LTD., Singapore (SG)

( * ) Notice: Subject to any disclaimer, the term of this patent is extended or adjusted under 35 U.S.C. 154(b) by 813 days.

(21) Appl. No.: 17/852,630

(22) Filed: Jun. 29, 2022

(65) Prior Publication Data

US 2023/0016091 A1    Jan. 19, 2023

(30) Foreign Application Priority Data

Jul. 19, 2021    (GB) ...................................... 2110343

(51) Int. Cl.
| | |
|---|---|
| *H01L 21/67* | (2006.01) |
| *B41F 15/20* | (2006.01) |
| *B41F 16/02* | (2006.01) |
| *H01L 21/677* | (2006.01) |
| *H01M 8/0286* | (2016.01) |
| *H01M 8/1004* | (2016.01) |

(52) U.S. Cl.
CPC .............. *B41F 15/20* (2013.01); *B41F 16/02* (2013.01); *H01L 21/67201* (2013.01); *H01L 21/67207* (2013.01); *H01L 21/6776* (2013.01); *H01M 8/0286* (2013.01); *H01M 8/1004* (2013.01)

(58) Field of Classification Search
None
See application file for complete search history.

(56) References Cited

U.S. PATENT DOCUMENTS

| | | | |
|---|---|---|---|
| 5,168,916 A | 12/1992 | Doriath et al. | |
| 6,151,796 A | 11/2000 | Karamatsu et al. | |
| 6,183,564 B1 * | 2/2001 | Reynolds ............ | H01L 21/6719 |
| | | | 156/345.31 |
| 6,497,734 B1 * | 12/2002 | Barber .............. | H01L 21/67017 |
| | | | 438/909 |

(Continued)

FOREIGN PATENT DOCUMENTS

| | | | |
|---|---|---|---|
| EP | 1073138 A2 | 1/2001 | |
| JP | S63-290679 A | 11/1988 | |

(Continued)

*Primary Examiner* — Binu Thomas
(74) *Attorney, Agent, or Firm* — OSTROLENK FABER LLP

(57) ABSTRACT

A degassing chamber for degassing a material located on a workpiece, comprises a vacuum source and a vacuum reservoir in fluid communication with the vacuum source, a secondary chamber, a port valve which is movable between an open position to allow passage of a workpiece therethrough between the exterior of the degassing chamber and the secondary chamber and a closed position in which the port valve is fluidly sealed, and a reservoir valve which is movable between an open position to provide fluid communication between the secondary chamber and the vacuum reservoir and a closed position in which the reservoir valve is fluidly sealed. The degassing chamber may be provided subsequent to a printing machine in a production line, and has particular application for degassing silicone material when producing fuel cells.

8 Claims, 8 Drawing Sheets

(56)                    References Cited

U.S. PATENT DOCUMENTS

| | | | |
|---|---|---|---|
| 2003/0131741 A1* | 7/2003 | Kawakita ................ | B41F 15/12 |
| | | | 101/123 |
| 2013/0312835 A1* | 11/2013 | Minshall ........... | H01L 21/67201 |
| | | | 137/12 |
| 2017/0115058 A1* | 4/2017 | Käske ........................ | B08B 3/04 |
| 2018/0061689 A1* | 3/2018 | Bluck .............. | H01L 21/67173 |

FOREIGN PATENT DOCUMENTS

| | | |
|---|---|---|
| JP | H11-47668 A | 2/1999 |
| JP | 2000-106376 A | 4/2000 |
| JP | 2000-202986 A | 7/2000 |
| JP | 2004-146384 A | 5/2004 |
| JP | 2004-167709 A | 6/2004 |
| JP | 2010-201859 A | 9/2010 |
| JP | 2011-043183 A | 3/2011 |
| WO | WO 2012/117696 A1 | 9/2012 |

* cited by examiner

POST-PRINT VACUUM DEGASSING

This application claims priority to Great Britain Patent Application No. 2110343.7, filed Jul. 19, 2021.

TECHNICAL FIELD

This invention relates to a degassing chamber, a production line for the production of workpieces, a printing machine for printing a printing medium onto a workpiece, a method for degassing a material printed onto a workpiece, and a method of producing a printed workpiece.

BACKGROUND AND PRIOR ART

Proton-exchange membrane fuel cells, which are also known as polymer electrolyte membrane fuel cells (both commonly abbreviated to "PEM fuel cells"), show promise as a viable next-generation fuel cell solution. As is generally know, PEM fuel cells typically comprise a plurality of layers or plates which may be assembled together to form a stack. It is advantageous to surround each plate with a suitable gasket to form an edge seal. A suitable material for such gaskets is room-temperature vulcanizing ("RTV") silicone, which has adhesive properties and begins to cure from wet to a strong yet flexible resiliently deformable material as soon as it is exposed to air.

In order to achieve efficient and streamlined PEM fuel cell production, it is proposed to produce such gaskets by printing such RTV silicone material (or generally similar materials) directly onto a PEM fuel cell plate, using an industrial screen-printing process. In such a process, a printing machine is used to apply a print medium onto a workpiece by applying the print medium through an aperture or pattern of apertures in a printing screen (sometimes referred to as a mask or stencil) using an angled blade or squeegee.

However, a problem exists with such an approach in that it has been found that the turbulent nature of the printing process unavoidably introduces air bubbles into the wet gasket material. However, the presence of air bubbles in the gasket material is detrimental to the reliability of operation, and so ideally the gasket material should be bubble-free.

The present invention seeks to reduce the presence of air bubbles in printed gasket material to operationally acceptable levels.

In accordance with the present invention this aim is achieved by providing a degassing chamber which can receive freshly-printed workpieces, on which the printed material is still wet, and subject them to an at least partial vacuum, thus removing bubbles from the printed material, using a vacuum reservoir which can maintain the at least partial vacuum despite introduction and removal of workpieces from the degassing chamber.

For the purposes of the present disclosure, the term "wet" as used here means that the material is not fully set, but has a sufficiently low viscosity so that bubbles entrained therein are free to move through the material when subjected to a vacuum.

Applicant is not aware of any known process in which freshly-printed articles, not just components of fuel cells by any other workpieces, such as, for example, semiconductor or metallic wafers, boards etc, are subjected to vacuum degassing, nor any known apparatus which is suitable for performing such degassing.

SUMMARY OF THE INVENTION

In accordance with a first aspect of the present invention there is provided a degassing chamber for degassing a material located on a workpiece, comprising:

a vacuum source for creating at least a partial vacuum, and a vacuum reservoir in fluid communication with the vacuum source such that the at least partial vacuum may be produced and maintained within the vacuum reservoir, a secondary chamber, a port valve which is movable between an open position to allow passage of a workpiece therethrough between the exterior of the degassing chamber and the secondary chamber and a closed position in which the port valve is fluidly sealed, and a reservoir valve which is movable between an open position to provide fluid communication between the secondary chamber and the vacuum reservoir and a closed position in which the reservoir valve is fluidly sealed.

In accordance with a second aspect of the present invention there is provided a production line for the production of workpieces, comprising a printing machine and the degassing chamber of any preceding claim, the degassing chamber located within the production line so as to receive a workpiece after it has been printed by the printing machine.

In accordance with a third aspect of the present invention there is provided a printing machine for printing a printing medium onto a workpiece, comprising a degassing chamber for degassing the printing medium after it has been printed onto the workpiece.

In accordance with a fourth aspect of the present invention there is provided a method for degassing a material printed onto a workpiece, comprising the steps of:

i) providing a degassing chamber in accordance with the first aspect, ii) using the vacuum source to produce and maintain an at least partial vacuum in the vacuum reservoir, iii) inserting the workpiece into the secondary chamber via the port valve, and iv) closing the port valve, v) opening the reservoir valve to increase the vacuum within the secondary chamber, and vi) exposing workpiece to the at least partial vacuum so that the material printed onto the workpiece is subjected to the at least partial vacuum.

In accordance with a fifth aspect of the present invention there is provided a method of producing a printed workpiece, comprising the steps of:

i) printing a wet material onto a workpiece, ii) while the material remains wet, placing the printed workpiece into a degassing chamber to degas the material.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

Figure 1:
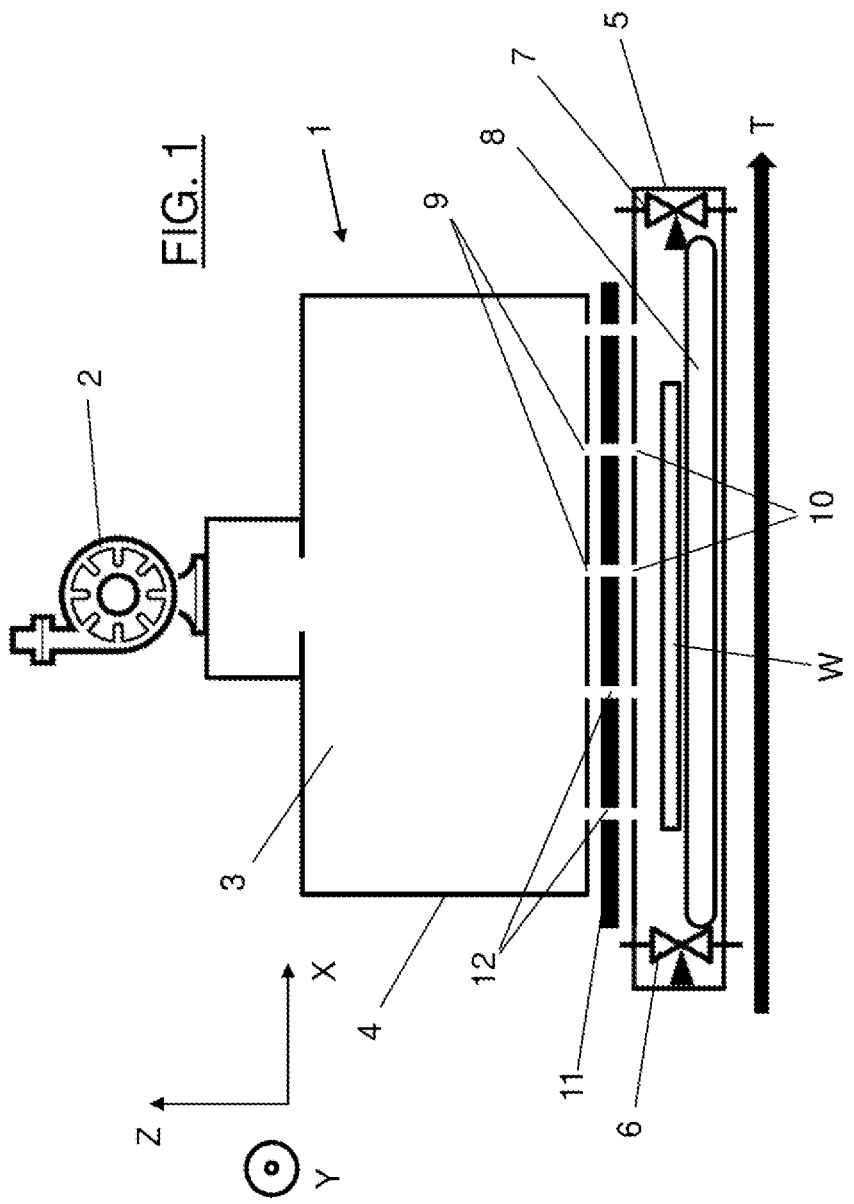
FIG. 1 schematically shows, in sectional side view, a degassing chamber according to a first embodiment of the present invention.
Figure 2:
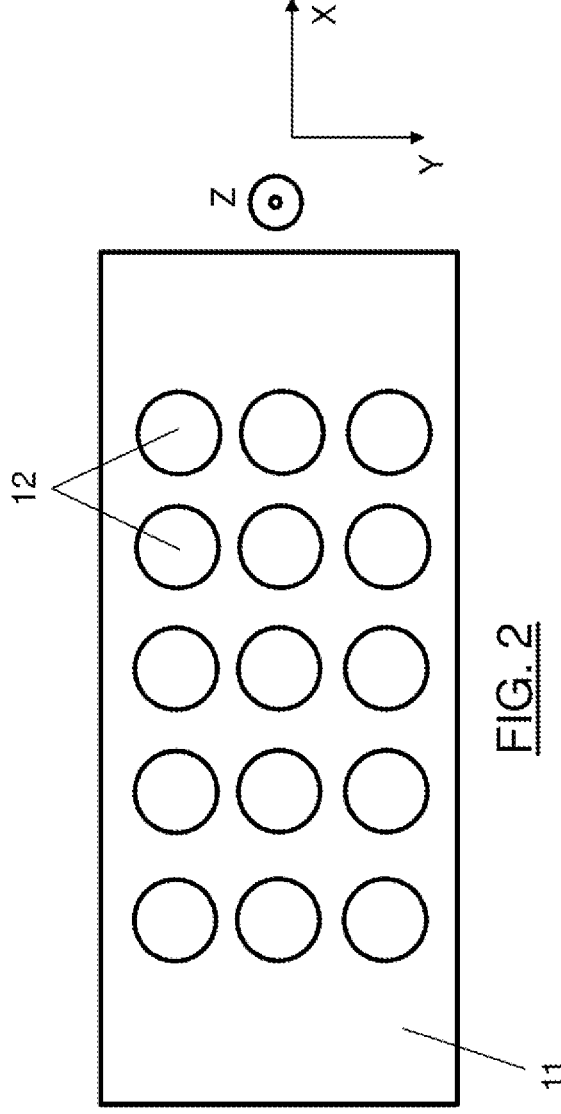
FIG. 2 schematically shows, from above, a valve plate for use in the degassing chambers of FIG. 1.

FIG. 1 schematically shows, in sectional side view, a degassing chamber 1 according to a first embodiment of the present invention. The degassing chamber 1 has two main parts, a vacuum reservoir 3 defined by a reservoir chamber 4, and a secondary chamber, in this embodiment a process chamber 5. The vacuum reservoir 3 is in fluid communication with a vacuum source 2, such as a high-speed, single-stage, vacuum pump (which are well-known per se), such that operation of the vacuum source 2 produces and maintains an at least partial vacuum or region of reduced pressure within the vacuum reservoir 3, for example at around 50 to 150 Mbar vacuum. The vacuum reservoir 3 is larger than the process chamber 5, for example having an internal volume about one hundred times greater than that of the process chamber 5. The process chamber 5 defines a processing region in which a workpiece W may be degassed by being exposed to the at least partial vacuum. The process chamber 5 is sealable at an end thereof by an input port valve 6, and sealable at another, opposite end thereof by an output port valve 7. Each of these port valves 6, 7 is movable between an open position to allow passage of a workpiece W therethrough between the exterior of the degassing chamber 1 and the process chamber 5, and a closed position in which the respective port valve 6, 7 is fluidly sealed. Known valves, such as slice valves, may be used as the input and output port valves 6, 7. A transport mechanism 8, such as a conveyor belt, rails or the like, is provided in the process chamber 5 and configured to move workpieces W from the exterior of the degassing chamber 1 and position them within the processing region. As shown, the transport mechanism 8 is operative to carry a workpiece W thereon from the exterior of the degassing chamber 1 (at the left side as shown), through the input port valve 6 when in its open position, into the processing region for degassing, then out through the output port valve 7 to the exterior of the degassing chamber 1 (on the right side as shown), in a linear transport direction T, which is parallel to the X axis as shown. In the case where the transport mechanism comprises a conveyor belt or similar, it will be noted that the belt may reside entirely within the process chamber 5, and so not affect the opening/ closing operation of the input and output port valves 6, 7. To transfer a workpiece W from or to the exterior of the degassing chamber 1, the transport mechanism 8 may cooperate with an externally provided transport mechanism (not shown) to receive or eject a workpiece W as required, noting that the workpiece W is relatively long, and so, when the respective port valve is open, may straddle the external transport mechanism and the transport mechanism 8 to provide safe handover between the respective transport mechanisms. A reservoir valve is also provided, which in this embodiment comprises a valve plate 11, which is movable between an open position to provide fluid communication between the process chamber 5 and the vacuum reservoir 3, and a closed position in which the reservoir valve is fluidly sealed. The valve plate 11, which is schematically shown from above in FIG. 2, comprises an array of throughbores 12 extending through the entire thickness of the valve plate 11. Corresponding reservoir openings 9 are located in the lower wall of the reservoir chamber 4, while corresponding process chamber openings 10 are located in the upper wall of the process chamber 5. The valve plate 11 is movably mounted so as to be movable between an open position in which each throughbore 12 aligns with a corresponding reservoir opening 9 and a corresponding process chamber opening 10, and a closed position in which each throughbore 12 is unaligned with any reservoir openings 9 or process chamber openings 10. Having a two-dimensional array of throughbores 12/openings 9, 10 allows the creation of a profiled motion on the valve plate 11 to ensure a consistent air speed during evacuation of the process chamber 5.

All valves (i.e. input and output port valves 6, 7 and the reservoir valve) as well as the transport mechanism 8, may be actuated and controlled by well-known means, for example by respective linear or rotary actuators under the control of a single control means (not shown) such as a computer, processor or the like. Similarly, the vacuum source 2 may also be controlled by the same or a separate control means.

In a typical operational sequence:

i) Vacuum source 2 runs continually;

ii) The vacuum reservoir 3 is evacuated to low vacuum (for example about 50 mBar) with the reservoir valve closed;

iii) The input port valve 6 is opened;

iv) A workpiece W enters the process chamber 5, carried by the transport mechanism 8;

v) Input port valve 6 and output port valve 7 are closed;

vi) The reservoir valve is opened, so that the pressure very rapidly equalises between the vacuum reservoir 3 and the process chamber 5 (for example at about 100 mBar);

vii) Wet material printed onto the workpiece W in the process chamber 5 degasses;

viii) The reservoir valve is closed;

ix) The output port valve 7 is opened, releasing the process chamber 5 to atmosphere; and x) The workpiece W is transported by the transport mechanism 8 from the process chamber 5 and out through the output port valve 7.

The above process may be repeated for each workpiece that requires degassing. With this two-chamber arrangement, an at least partial vacuum can be maintained within the vacuum reservoir 3, while workpieces W are introduced or removed from the process chamber 5, so that when the reservoir valve is opened, an at least partial vacuum is very quickly introduced in the process chamber 5. This rapid pressure reduction is essential for enabling an acceptably fast throughput of workpieces W.

Figure 3:
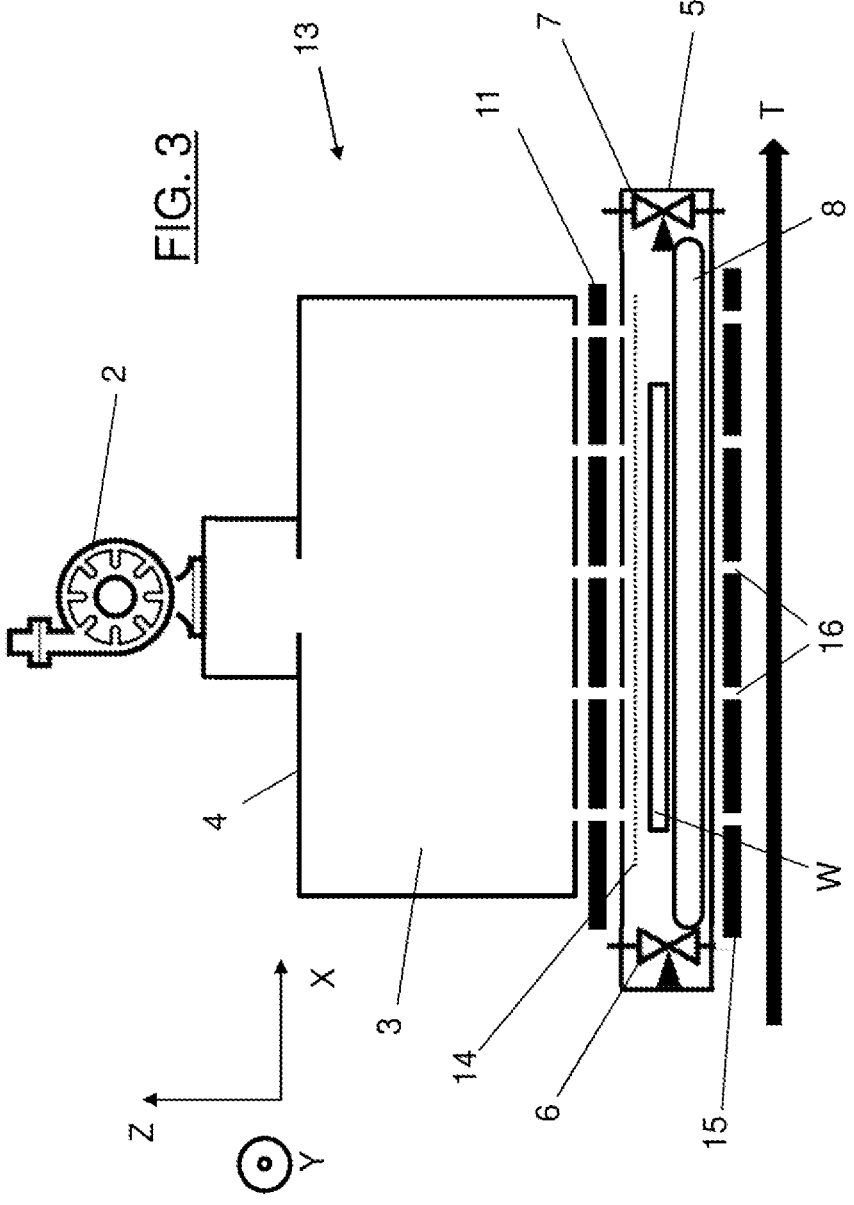
FIG. 3 schematically shows, in sectional side view, a degassing chamber according to a second embodiment of the present invention.

FIG. 3 schematically shows, in sectional side view, a degassing chamber 13 according to a second embodiment of the present invention. The degassing chamber 13 of this embodiment has many similarities with the degassing chamber 1 shown in FIG. 1, and so detailed description of the similar parts is not required. Furthermore, reference numerals for similar parts are retained for simplicity.

The degassing chamber 13 of this second embodiment includes two significant differences to that shown in FIG. 1. Firstly, an air diffuser 14 is provided in the process chamber 5. The air diffuser 14 acts to disturb airflow during operation of the reservoir valve (for example the ensuing airflow from the process chamber to the vacuum reservoir 3 when the reservoir valve is opened), to prevent damage to the still-wet printed material (e.g. a printed gasket) on the workpiece W being degassed, and also potentially to reduce or remove resulting forces on the workpiece W itself. The air diffuser could potentially take many forms, such as, for example, a mesh or perforated layer of rigid material, such as a metal or plastics material, or an arrangement of one or more baffles, any of which may be located relative to the reservoir valve as required for the intended application.

Secondly, a vent valve is provided which is controllable to regulate venting, i.e. to control air in-rush into the process chamber during venting, which uncontrolled could disturb the printed material or the workpiece W. As shown, the vent valve comprises a vent valve plate 15, similar in construction to reservoir valve plate 11 and having throughbores 16, which may cooperate with venting openings (not shown) in the process chamber 5 in the same manner of operation as the reservoir valve.

The embodiments shown in FIGS. 1 and 3 include a separate input and output for the workpieces, allowing transport of the workpieces along a single direction. However, it should be noted that in alternatives embodiments, a single input/output port may be provided at the process chamber, with a single input/output port valve. With such an arrangement, a workpiece may be loaded into the process chamber through the input/output port valve, degassed as above, then ejected from the process chamber through the same input/output port valve. This type of arrangement is also described below with reference to FIG. 8.

Figure 4:
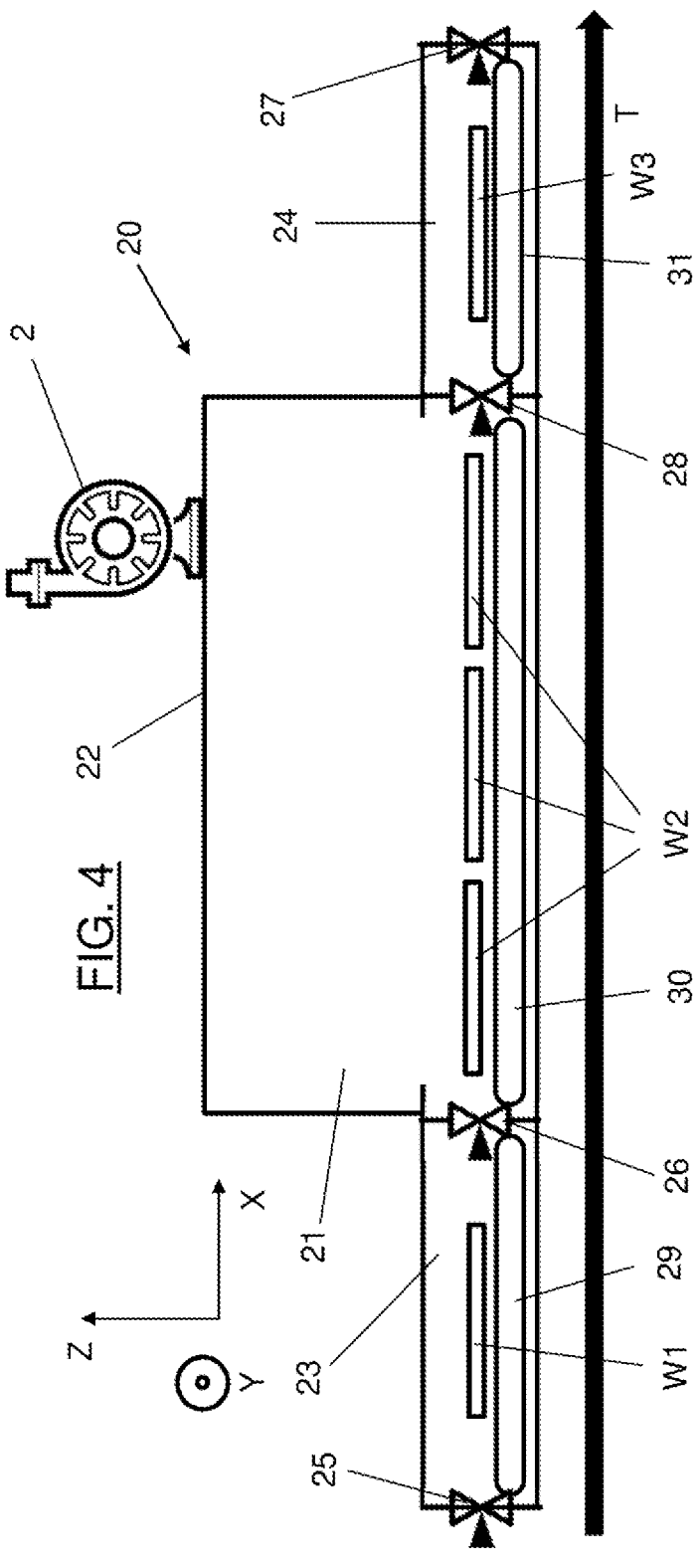
FIG. 4 schematically shows, in sectional side view, a degassing chamber according to a third embodiment of the present invention.

It has been noted previously that a high throughput of workpieces is desirable. It has also been found that a degassing operation may take longer than a preceding printing operation, for example about 10-15 seconds as opposed to about 1 second for a printing operation. FIG. 4 schematically shows, in sectional side view, a degassing chamber 20 according to a third embodiment of the present invention, in which a high throughput may be maintained. As with previous embodiments, a vacuum source 2 is provided to create an at least partial vacuum, in a vacuum reservoir 21 defined by a process chamber 22 (in this embodiment, the processing region is located within the vacuum reservoir 31). Two secondary chambers are connected to the process chamber 22, an input airlock 23 and an output airlock 24. Each of these airlocks 23, 24 is bounded by two valves, i.e. input airlock 23 comprises an input port valve 25 and an input reservoir valve 26 is provided between the input airlock 23 and the process chamber 22, while output airlock 24 comprises an output port valve 27 and an output reservoir valve 28 is provided between the output airlock 24 and the process chamber 22. The input port valve 25 is movable between an open position to allow passage of a workpiece W therethrough between the exterior of the degassing chamber 20 and the input airlock 23 and a closed position in which the input port valve 25 is fluidly sealed. The output port valve 27 is movable between an open position to allow passage of a workpiece W therethrough between the exterior of the degassing chamber 20 and the output airlock 24 and a closed position in which the output port valve 27 is fluidly sealed. The input reservoir valve 26 is movable between an open position to provide fluid communication between the input airlock 23 and the vacuum reservoir 21 and a closed position in which the input reservoir valve 26 is fluidly sealed. The output reservoir valve 28 is movable between an open position to provide fluid communication between the output airlock 24 and the vacuum reservoir 21 and a closed position in which the output reservoir valve 28 is fluidly sealed. Various types of valve are known in the art which could be used as these valves, such as slice valves for example. A transport mechanism is provided, comprising an input transport 29 located in the input airlock 23, a process transport 30 located in the processing chamber 22 and an output transport 31 located in the output airlock 24, is configured to sequentially transport workpieces W from the exterior of the degassing chamber 20, then through the input port valve 25, through the input airlock 23, then through the input reservoir valve 26 into the processing chamber 22, position them within the processing region, and subsequently move them through the output reservoir valve 28 to the output airlock 24, then out through the output port valve 27 to the exterior of the degassing chamber 20, along a transport direction T which is parallel to the X direction shown. Similarly to previous embodiments, the transport mechanism can be produced in various ways which are known in the art per se, such as conveyor belts, rails or the like.

All valves (i.e. input and output port valves 25, 27 and the input and output reservoir valves 26, 28) as well as the transport mechanism, may be actuated and controlled by well-known means, for example by respective linear or rotary actuators under the control of a single control means (not shown) such as a computer, processor or the like. Similarly, the vacuum source 2 may also be controlled by the same or a separate control means.

In a typical operational sequence:

i) Vacuum source 2 runs continually;

ii) The vacuum reservoir 21 is evacuated to low vacuum (for example about 50 mBar) with the input and output reservoir valves closed;

iii) The input port valve 25 is opened;

iv) A workpiece W enters the input airlock 23, carried by the input transport 29;

v) Input port valve 25 and output port valve 27 are closed;

vi) The input reservoir valve 26 is opened, so that the pressure very rapidly equalises between the vacuum reservoir 21 and the input airlock 23 (for example at about 100 mBar);

vii) The workpiece W is moved into the processing region of process chamber 22 by cooperating movement of the input transport 29 and process transport 30. Wet material printed onto the workpiece W begins to degas;

viii) The input reservoir valve 26 is closed—as soon as this occurs the input port valve 25 may be opened, a new workpiece received into the input airlock 23 and the input port valve 25 closed again;

ix) The workpiece W continues to move in the transport direction T within the process chamber 22, so that it continues to degas—while this is ongoing, the input reservoir valve 26 may open and the new workpiece transferred from the input airlock 23 to the process chamber 22, with the input reservoir valve 26 being closed after this transfer;

x) The output reservoir valve 28 is opened so that the pressure very rapidly equalises between the vacuum reservoir 21 and the output airlock 24 (for example at about 100 mBar), and the workpiece W is transferred from the process chamber 22 to the output airlock 24 by cooperation of process transport 30 and output transport 31;

xi) The output reservoir valve 28 is closed;

xii) The output port valve 27 is opened, releasing the output airlock 24 to atmosphere;

xiii) The workpiece W is transported by the output transport 31 from the output airlock 24 and out through the output port valve 27 to the exterior of the degassing chamber 20; and xiv) The output port valve 27 is closed. Once closed, the output reservoir valve 28 may be opened to allow the new workpiece to enter the output airlock 24.

This process may be continued indefinitely, permitting a constant, and high, throughput of degassed workpieces. In FIG. 4, the input airlock 23 and output airlock 24 can each receive a single workpiece (W1 and W3 respectively), while the process chamber 22 can receive three workpieces W2. However, different numbers of workpieces could be received within each chamber depending on the relative size of the workpieces and the chambers.

Figure 5:
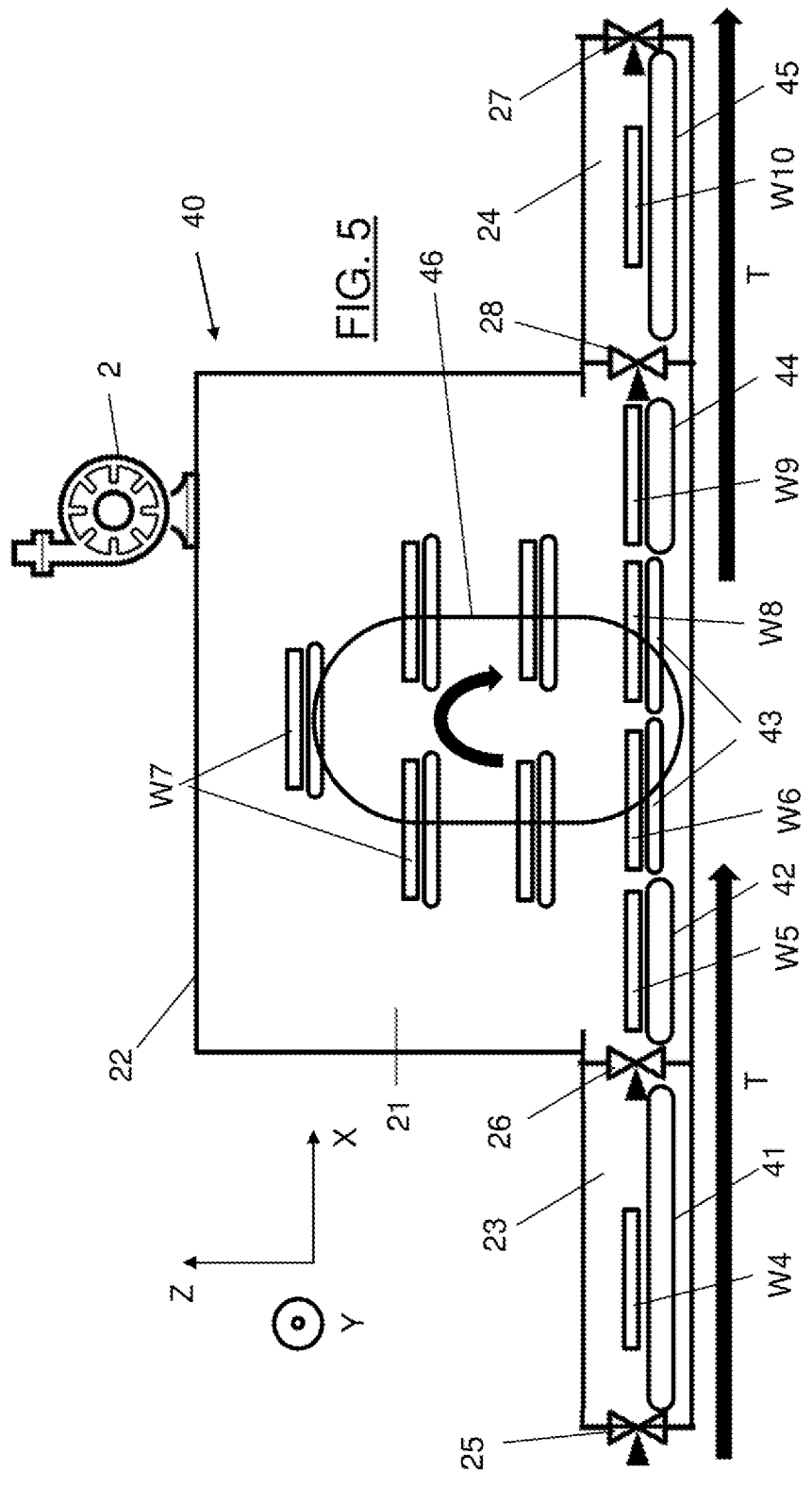
FIG. 5 schematically shows, in sectional side view, a degassing chamber according to a fourth embodiment of the present invention.

FIG. 5 schematically shows, in sectional side view, a degassing chamber 40 according to a fourth embodiment of the present invention. The degassing chamber 40 of this embodiment has many similarities with the degassing chamber 20 shown in FIG. 4, and so detailed description of the similar parts is not required. Furthermore, reference numerals for similar parts are retained for simplicity.

The degassing chamber 40, similarly to the degassing chamber 20 shown in FIG. 4, has a vacuum reservoir 21 defined by a process chamber 22, and input and output airlocks 23, 24 as secondary chambers. In this embodiment, the degassing time of each workpiece W within the processing region of process chamber 20 is increased, without adversely affecting throughput. As noted with previous embodiments, the vacuum reservoir 21 is relatively large, and in this embodiment the available space is used more efficiently by increasing the transport path length for each workpiece W within the processing region. In the embodiment shown, this is achieved by providing a paternoster lift 46 within the process chamber 22. The paternoster lift 56 includes a plurality of spaced-apart transport platforms 43, each configured to support a single workpiece W thereon, and able to transfer a workpiece between the respective transport platform 43 and a process transport 42, 44. Suitably, each transport platform could comprise conveyor belts, rails or the like. The transport platforms are arranged to rotate in a loop around the paternoster lift 46, in the generally clockwise direction shown, while remaining horizontal throughout the entire range of travel.

In more detail, the transport mechanism comprises an input transport 41 located in the input airlock 23, a first process transport 42 located in the processing chamber 22, a plurality of transport platforms 43 arranged on the paternoster lift 46, a second process transport 44 located in the processing chamber 22, and an output transport 45 located in the output airlock 24. This is configured to sequentially transport workpieces W from the exterior of the degassing chamber 40, then through the input port valve 25, through the input airlock 23, then through the input reservoir valve 26 into the processing chamber 22, position them within the processing region, and subsequently move them through the output reservoir valve 28 to the output airlock 24, then out through the output port valve 27 to the exterior of the degassing chamber 20, along a transport direction T which is generally parallel to the X direction shown, excepting of course the middle section where the workpieces travel on the paternoster lift 46. It can be seen that in the position shown, the two lowest transport platforms 43 are located at the same height as the first and second process transports 42,44. In this position, a workpiece W6 can be received onto a transport platform 43 from first process transport 42, while a workpiece W8 can be transferred from a transport platform 43 onto second process transport 44. Similarly to previous embodiments, the transport mechanism can be produced in various ways which are known in the art per se, such as conveyor belts, rails or the like. As shown, a single workpiece W4 is carried on input transport 41, a single workpiece W5 is carried on the first process transport 42, a single workpiece W6, W7, W8 may be carried on each transport platform 43, a single workpiece W9 is carried on the first process transport 44, and a single workpiece W10 is carried on the output transport 45. With this type of arrangement, the degassing time may be several times greater than for the linear arrangement of the previous embodiment.

Figure 6:
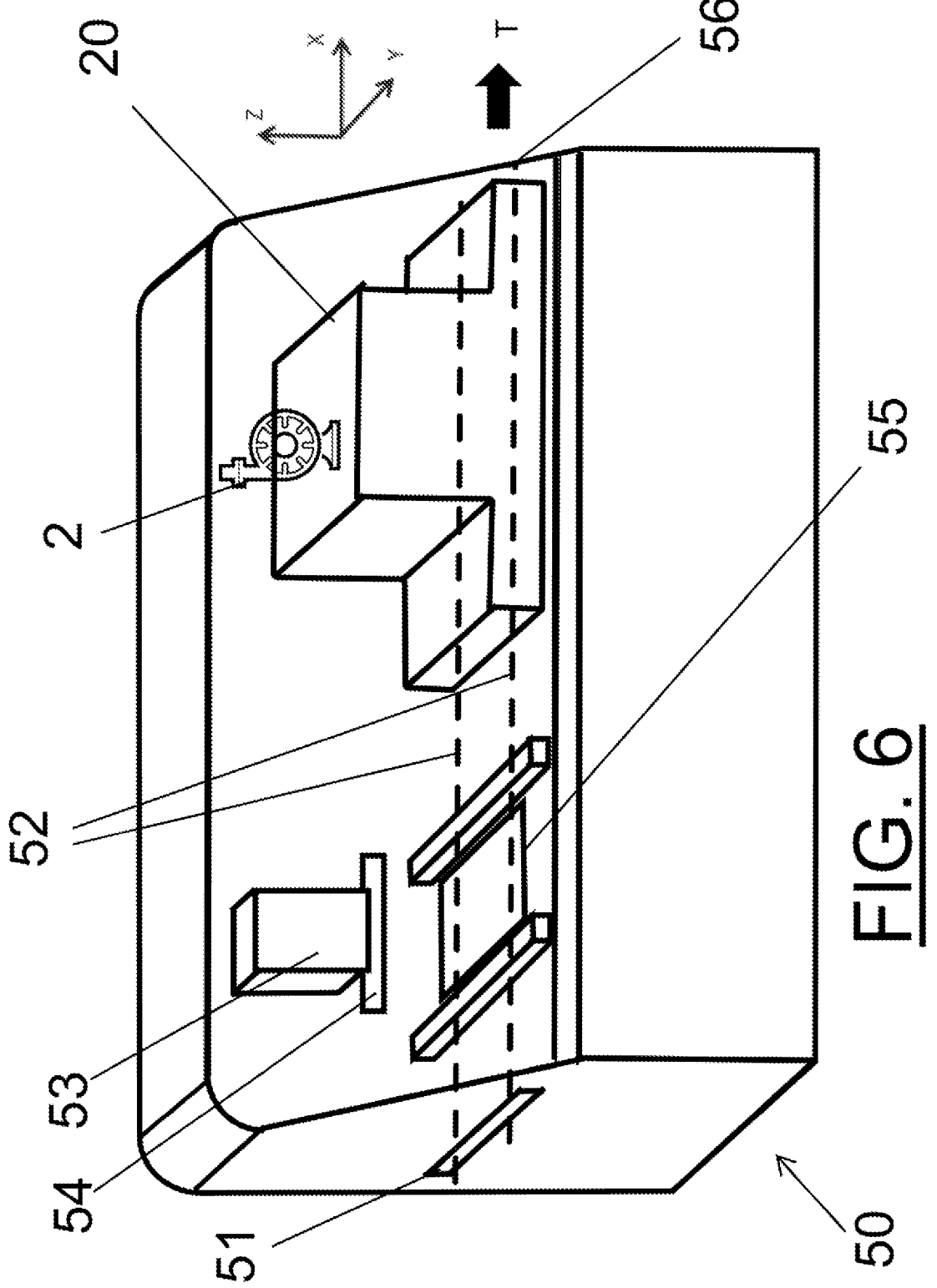
FIG. 6 schematically shows, in perspective view, a printing machine with an integrated degassing chamber, according to a further embodiment of the present invention.

RTV silicone starts setting quickly after printing, and degassing can only be performed while the silicone is sufficiently wet. It is therefore important for such applications that degassing occurs very soon after printing. The quickest way to do this is to provide a degassing chamber integrated within a printing machine. FIG. 6 schematically shows, in perspective view, such a printing machine 50 with an integrated degassing chamber 20, such as that shown in FIG. 4, according to a further embodiment of the present invention. The main parts of printing machine 50 which provide screen-printing functionality are well-known per se and not especially relevant for the purposes of the present invention, and so will not be described in detail. However, it will be understood by those skilled in the art that the printing machine includes a entry 51 for receiving workpieces to be printed from a preceding part of a production line, and a transport mechanism, here comprising rails 52 for transporting workpieces within the printing machine 50 along a transport direction T, parallel to the X direction shown. With this embodiment, the transport mechanism is common to the part of the printing machine 50 with printing functionality and the integrated degassing chamber 20. The printing machine 50 includes a print head 53 carrying a squeegee 54, operative to sweep print medium, such as RTV silicone, onto underlying workpieces positioned by a positioning mechanism shown generally at 55, through a patterned stencil or screen (not shown). The printing machine also includes an exit 56 at its downstream side, through which printed workpieces may be ejected by the transport mechanism, and received by cooperating transport systems of the subsequent production line (not shown).

Figures 7, 9:
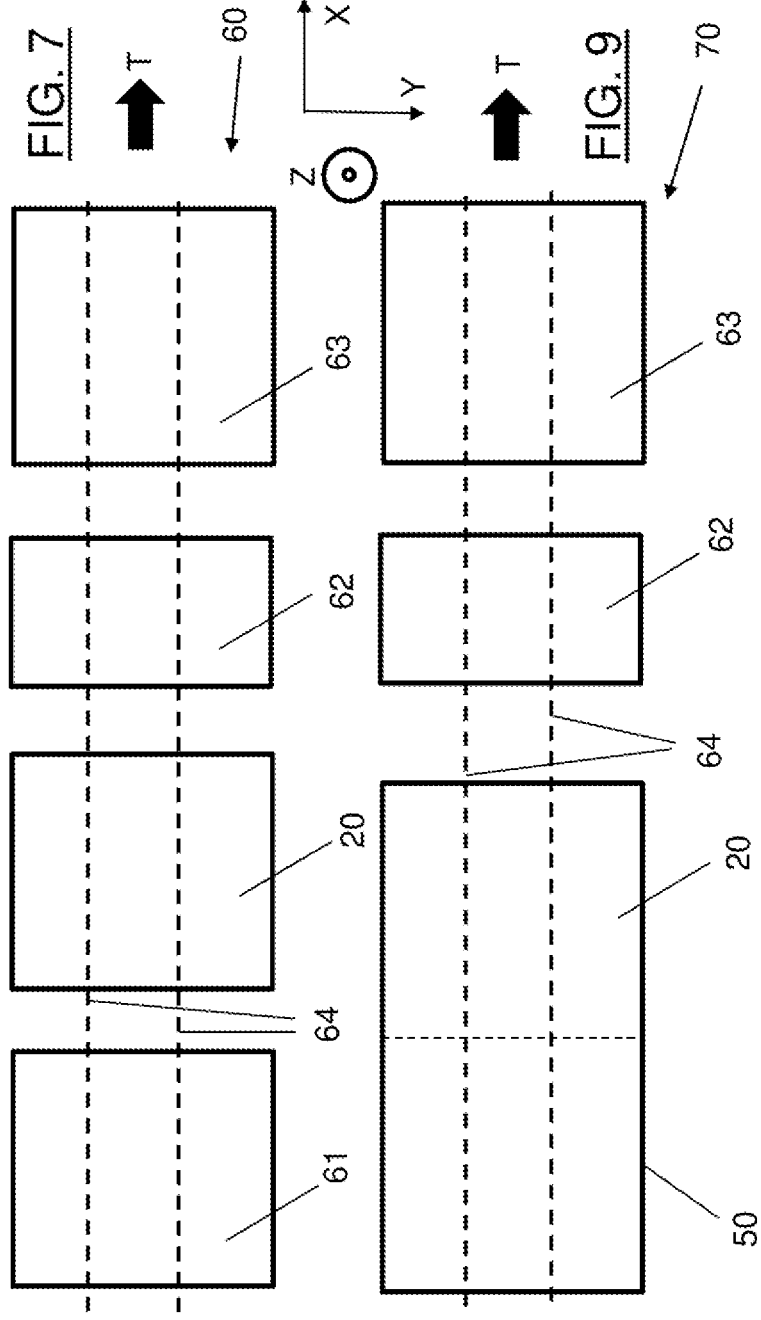
FIGS. 7 to 9 schematically show, from above, production lines including a degassing chamber in accordance with the present invention.
Figure 8:
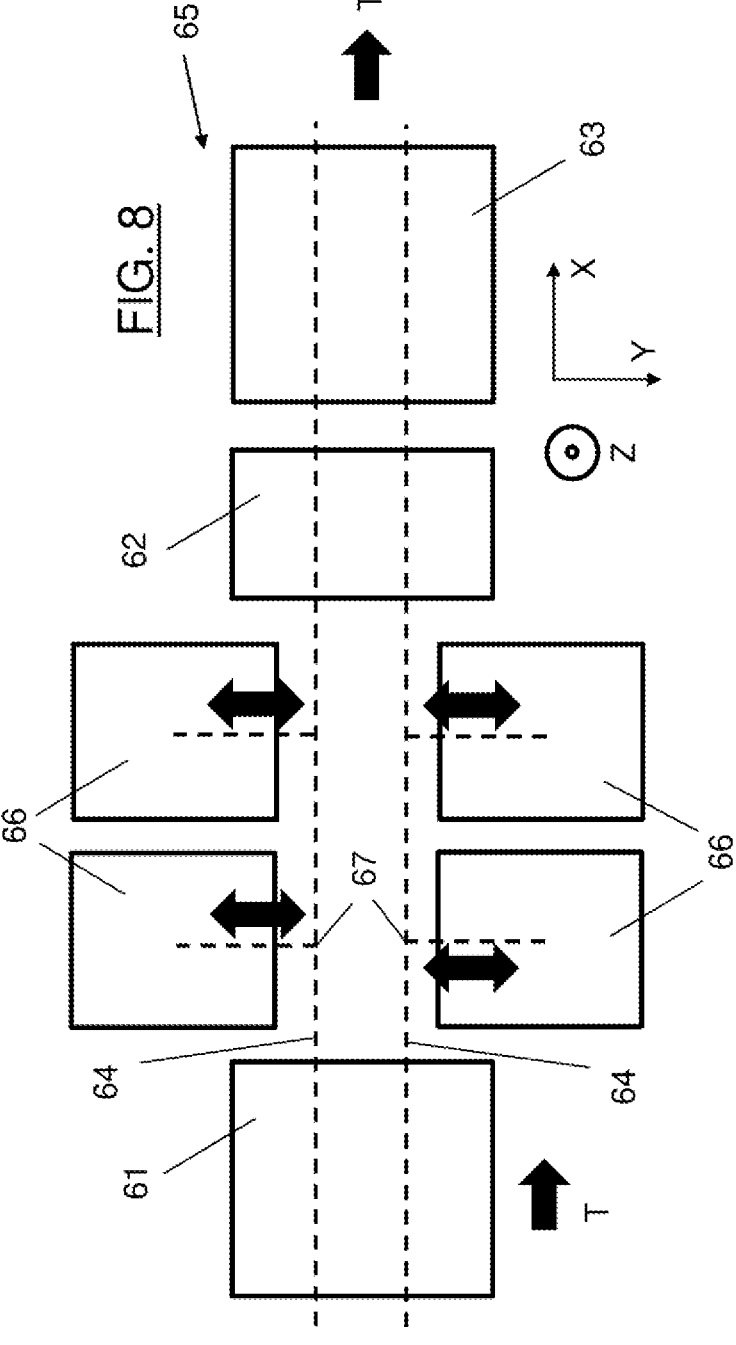

FIGS. 7 to 9 schematically show, from above, sections of various production lines each including a degassing chamber, in accordance with the present invention, suitable for manufacturing fuel cells including RTV silicone material printed gaskets. Each production line transports workpieces in a direction T parallel to the X axis, using a transport system 64 as is generally known in the art, such as conveyor belts, rails or the like. The transport mechanism of each degassing chamber shown integrates within this overall transport system 64. It should be noted that production lines may be single-line, in which components of the production line, such as printing machines are only operative to print a single workpiece at a time, or dual-line, in which components are operative to process two separate workpieces in a parallel configuration. The production lines shown in FIGS. 7 and 9 may be single or dual-line, while that shown in FIG. 8 is dual-line only. Those skilled in the art will recognise that additional or alternative components may be present in production lines, including components both upstream of the printing machines, and downstream of the degassing chamber, and therefore these illustrations are exemplary only. In these figures, for simplicity reference numerals are retained for like components as far as possible.

In FIG. 7, a section of a production line 60 is shown with a dedicated printing machine 61, i.e. a screen-printing machine, located upstream, which is directly or immediately followed in the downstream direction by a dedicated degassing chamber 20, such as that shown in FIG. 4. Downstream of the degassing chamber 20 is an inspection machine 62, used for checking the quality of the printed workpieces. Further downstream is shown a processing machine 63, which could, for example, comprise a placement machine, reflow oven or the like. Of course, other processing machines may also be included downstream.

In FIG. 8, a section of a production line 65 is shown with a dedicated dual-line printing machine 61 is located upstream. Directly or immediately following the printing machine 61 downstream are a plurality (here four) dedicated degassing chambers 66, with two degassing chambers communicating with each lane of the transport system 64 via hubs 67, so that printed workpieces may be selectively passed to a particular degassing chamber 66 after leaving the printing machine 61. Each degassing chamber 66 may comprise a degassing chamber similar to that shown in FIG. 1 or 3, but having only a single input/output port as described previously. Each degassing chamber 66 therefore forms a stub along the production line. Providing a plurality of degassing chambers in this way acts to improve through-put of workpieces. The degassing chambers 66 are immediately followed in the downstream direction by an inspection machine 62, used for checking the quality of the printed workpieces. Further downstream is shown a processing machine 63, which could, for example, comprise a placement machine, reflow oven or the like. Of course, other processing machines may also be included downstream.

In FIG. 9, a section of a production line 70 is shown with a printing machine 50 with integrated degassing chamber 20, similar to that shown in FIG. 6, located upstream. This is immediately followed in the downstream direction by an inspection machine 62, used for checking the quality of the printed workpieces. Further downstream is shown a processing machine 63, which could, for example, comprise a placement machine, reflow oven or the like. Of course, other processing machines may also be included downstream.

The above-described embodiments are exemplary only, and other possibilities and alternatives within the scope of the invention will be apparent to those skilled in the art. For example, while the present invention has been described with particular reference to fuel cells and the printing and degassing of RTV silicone, the apparatus described may be used for degassing many different types of wet printed materials, for many different applications.

REFERENCE NUMERALS USED 1, 13, 20, 40, 66—Degassing chamber
2—Vacuum source
3, 21—Vacuum reservoir
4—Reservoir chamber
5, 22—Process chamber
6—Input port valve
7—Output port valve
8—Transport mechanism
9—Reservoir opening
10—Process chamber opening

10

11—Valve plate
12—Throughbore
14—Air diffuser
15—Vent valve plate
16—Through bore
23—Input airlock
24—Output airlock
25—Input port valve
26—Input reservoir valve
27—Output port valve
28—Output reservoir valve
29, 41—Input transport
30, 42, 44—Process transport
31, 45—Output transport
43—Transport platform
46—Paternoster lift
50—Printing machine
51—Entry
52—Rails
53—Print head
54—Squeegee
55—Positioning mechanism
56—Exit
60, 65, 70—Production line
61—Printing machine
62—Inspection machine
63—Processing machine
64—Transport system
W, W1-W10—Workpieces
T—Transport direction

The invention claimed is:

1. A production line for the production of workpieces, comprising a printing machine and a degassing chamber separate to the printing machine for degassing a material located on a workpiece, the degassing chamber located within the production line so as to receive a workpiece after it has been printed by the printing machine, and wherein the degassing chamber comprises:

a vacuum source for creating at least a partial vacuum, and a vacuum reservoir in fluid communication with the vacuum source such that the at least partial vacuum may be produced and maintained within the vacuum reservoir, a secondary chamber, a port valve which is movable between an open position to allow passage of a workpiece therethrough between the exterior of the degassing chamber and the secondary chamber and a closed position in which the port valve is fluidly sealed, and a reservoir valve which is movable between an open position to provide fluid communication between the secondary chamber and the vacuum reservoir and a closed position in which the reservoir valve is fluidly sealed.

2. The production line of claim 1, comprising a processing region in which the material of the workpiece may be degassed.

3. The production line of claim 2, comprising a transport mechanism configured to move the workpiece from the exterior of the degassing chamber and position it within processing region.

4. The production line of claim 3, comprising a process chamber connected to the secondary chamber, the process chamber comprising the vacuum reservoir, and with the processing region being located within the process chamber; and wherein the secondary chamber comprises an airlock, and the degassing chamber further comprises a second airlock, the arrangement being such that the transport mechanism is operative to sequentially transport a workpiece from the exterior of the degassing chamber, then through the port valve into the airlock, then through the reservoir valve into the processing region of the vacuum reservoir, then into the second airlock, and then out of the second airlock to the exterior of the degassing chamber.

5. A degassing chamber for degassing a material located on a workpiece, comprising:

a vacuum source for creating at least a partial vacuum, and a vacuum reservoir in fluid communication with the vacuum source such that the at least partial vacuum may be produced and maintained within the vacuum reservoir, a secondary chamber, a port valve which is movable between an open position to allow passage of a workpiece therethrough between the exterior of the degassing chamber and the secondary chamber and a closed position in which the port valve is fluidly sealed, a reservoir valve which is movable between an open position to provide fluid communication between the secondary chamber and the vacuum reservoir and a closed position in which the reservoir valve is fluidly sealed, a processing region in which the material of the workpiece may be degassed, and a transport mechanism configured to move the workpiece from the exterior of the degassing chamber and position it within the processing region, wherein the processing region is located within the secondary chamber, and the reservoir valve comprises a valve plate having a throughbore, the valve plate being movably mounted so as to be movable between an open position in which the throughbore aligns with an opening provided in an outer wall of the vacuum reservoir and/or the secondary chamber, and a closed position in which the throughbore is unaligned with the opening.

6. The degassing chamber of claim 5, wherein the valve plate is mounted between the secondary chamber and the vacuum reservoir, and the secondary chamber and the vacuum reservoir each comprise respective openings in an outer wall thereof, the openings being aligned with the throughbore to provide fluid communication therethrough when the valve plate is in the open position.

7. The degassing chamber of claim 5, wherein the valve plate is mounted in one of the secondary chamber and the vacuum reservoir.

8. A printing machine for printing a printing medium onto a workpiece, comprising a degassing chamber for degassing the printing medium after it has been printed onto the workpiece, wherein the degassing chamber comprises the degassing chamber of claim 5.

* * * * *